United States Patent [19]

Doi

[11] 3,980,963
[45] Sept. 14, 1976

[54] STABILIZED TRANSISTOR AMPLIFIER
[75] Inventor: Toshitada Doi, Yokohama, Japan
[73] Assignee: Sony Corporation, Tokyo, Japan
[22] Filed: Sept. 23, 1974
[21] Appl. No.: 508,338

[30] Foreign Application Priority Data
Sept. 27, 1973 Japan............................. 48-108762

[52] U.S. Cl.................................. 330/23; 330/22;
330/24; 330/40; 307/310
[51] Int. Cl.² ........................................... H03F 3/04
[58] Field of Search............... 330/22, 23, 38 M, 40,
330/24; 307/297, 310

[56] References Cited
UNITED STATES PATENTS

| 3,369,187 | 2/1968 | Csicsatka........................ 330/22 X |
| 3,430,076 | 2/1969 | Overtveld........................ 330/23 X |
| 3,534,245 | 10/1970 | Limberg........................ 307/297 X |
| 3,573,645 | 4/1971 | Wheatley........................ 330/22 X |
| 3,825,778 | 7/1974 | Ahmed............................ 307/310 |

OTHER PUBLICATIONS
Horowitz, "Design for Stereo", *Radio–Electronics*, vol. 42 No. 4, Apr. 1971, pp. 52, 53, 58, 59, 92.
Morgan, "Transistor Serves as a DC Coupler Simplifies Amplifier Design," *Electronic Design* 6 Mar. 14, 1968, p. 220.

*Primary Examiner*—James B. Mullins
*Attorney, Agent, or Firm*—Lewis H. Eslinger; Alvin Sinderbrand

[57] ABSTRACT
A stabilized transistor amplifier including an amplifying transistor and its biasing circuit consisting of such elements as a power supply source, diodes and resistors in which several circuit constants of the biasing circuit at a certain pre-selected temperature are selected so as to compensate for or cancel changes in characteristic of the amplifying transistor, the power supply source, the diodes and the resistors in combination, so that the amplifier operates stably over a wide range of the ambient temperature.

9 Claims, 18 Drawing Figures

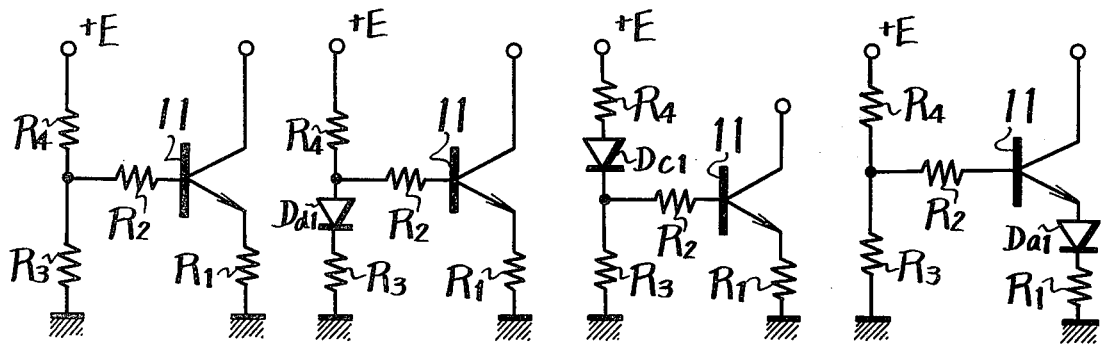
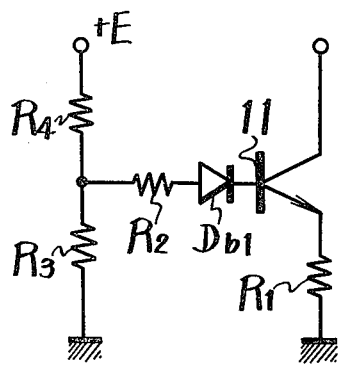
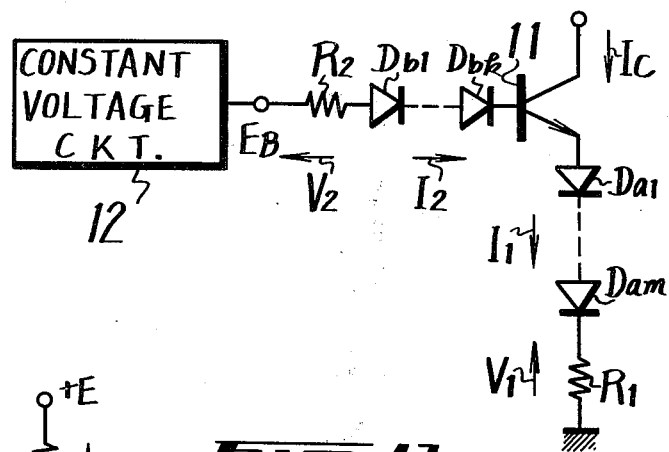
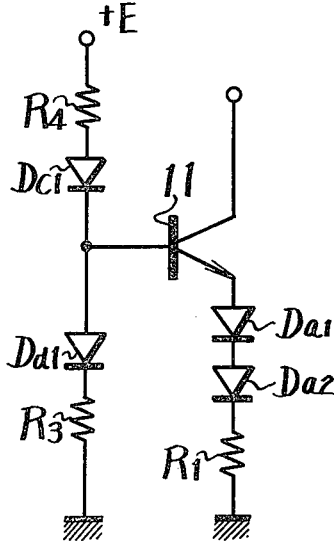
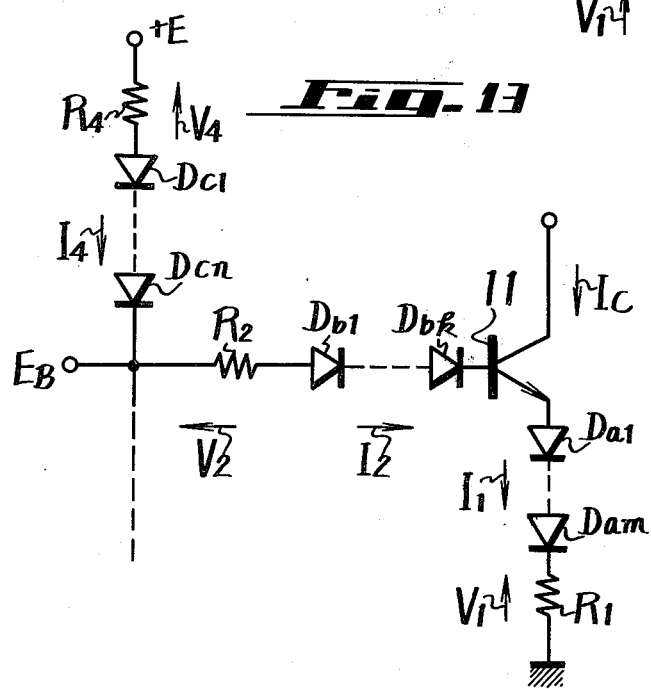

3,980,963

STABILIZED TRANSISTOR AMPLIFIER

BACKGROUND OF THE INVENTION

1. Field of the Invention

This invention relates generally to a transistor amplifier and more particularly to a stabilized transistor amplifier.

2. Description of the Prior Art

A lot of efforts have been made in the technical field to provide a stabilized transistor amplifier regardless of ambient temperature variations and several practical circuit arrangements for such a purpose are well known in the prior art.

However, in most of such known circuit arrangements, attention has been paid only to changes in characteristic of semiconductors used in the circuit and not to changes in characteristic of a power supply voltage and resistors used in the same circuit when the ambient temperature changes, so that the circuits often do not operate satisfactorily over a wide range of the ambient temperature under the influence of the changes in characteristic of the power supply voltage and the resistors.

OBJECTS OF THE INVENTION

Accordingly, it is an object of this invention to provide an improved and novel stabilized transistor amplifier avoiding disadvantages inherent to the prior art.

It is another object of this invention to provide an improved stabilized amplifier which operates with superior stability over a wide range of the ambient temperature.

It is a further object of this invention to provide an improved transistor amplifier stabilized over a wide range of the ambient temperature regardless not only of changes in characteristic of semiconductive devices, but also of changes in characteristic of a power supply voltage and resistors used in the same circuit.

SUMMARY OF THE INVENTION

In a transistor amplifier according to this invention, attention is paid not only to changes in characteristic of semiconductor devices used in the circuit, but also to changes in characteristic of a power supply voltage and resistors used in the same circuit, and all of such changes as mentioned above are compensated for or cancelled by selecting the initial condition of several circuit constants at a certain pre-selected ambient temperature.

The features of the invention are set forth with particularity in the appended claims. The invention itself, however, both as to its organization and method of operation, together with further objects and advantages thereof, may best be understood by reference to the following description taken in connection with the accompanying drawings.

DESCRIPTION OF THE DRAWING

FIGS. 6 – 11 are embodied circuit diagrams respectively relative to the circuit of FIG. 4.

FIG. 12 is a circuit diagram showing an embodiment in which the input voltage $E_B$ is supplied from a constant voltage source and maintained constant regardless of the ambient temperature in the circuit of FIG. 4.

FIG. 13 is a circuit diagram showing an embodiment in which the input voltage $E_B$ is obtained by adopting a constant current source in the circuit of FIG. 4.

DESCRIPTION OF THE PREFERRED EMBODIMENTS

For better understanding this invention, a prior art transistor amplifier circuit will first be described with reference to FIG. 1. With the prior art transistor amplifier circuit depicted in FIG. 1, the DC biasing current for the transistor is constant regardless of the ambient temperature change.

Figure 1:
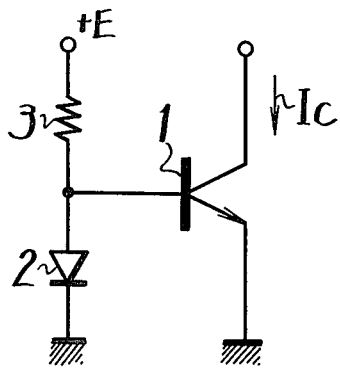
FIG. 1 is a typical stabilized transistor amplifier of the prior art.

In the transistor amplifier circuit shown in FIG. 1, between the base of an amplifying transistor 1 whose emitter is grounded and the ground there is connected to a diode 2, and between the base of the transistor 1 and a voltage source of +E there is connected a resistor 3. With this circuit, when the forwardly biased voltage drop across the PN-junction between the base and emitter of the transistor 1 is changed in accordance with ambient temperature variation, the forwardly biased voltage drop across the diode 2 is changed similarly. As a result, a DC biasing current $I_C$ which flows through the collector of the transistor 1 is constant irrespective of the ambient temperature change. This can be said of the assumption that the resistance value of the resistor 3 is constant irrespective of the ambient temperature change. However, in fact the resistance value of the resistor 3 is changed in accordance with the ambient temperature change, so that the DC biasing current $I_C$ is not constant. If the circuit depicted in FIG. 1 is formed on a single semiconductor wafer as an integrated circuit, the temperature coefficient of the resistor 3 becomes positive and is relatively high. As a result, the DC biasing current $I_C$ tends to decrease in accordance with increase of the ambient temperature.

Figure 2:
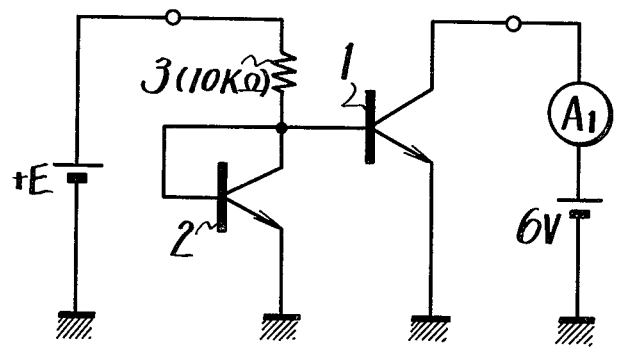
FIG. 2 is a simplified diagram for measuring a characteristic of a circuit such as shown in FIG. 1.
Figure 3:
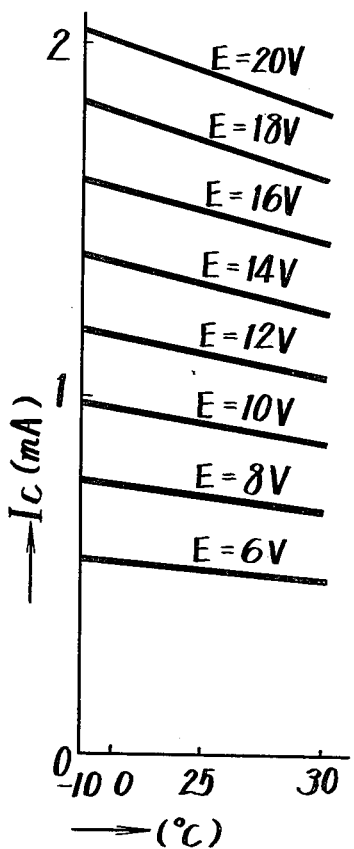
FIG. 3 is a graph to be used for explaining the characteristic of the circuit shown in FIGS. 1 and 2.

FIG. 2 shows a circuit for measuring the DC biasing current $I_C$ of the above circuit formed as an integrated circuit. In the embodiment of FIG. 2, a transistor 2 which is substantially same as the transistor 1 in construction and whose base and collectors are connected directly is used in place of the diode 2 of the embodiment shown in FIG. 1, and the resistance value of the resistor 3 is selected to be 10 KΩ. When a DC voltage of 6 volts is applied to the collector of the transistor 1, a DC voltage of +E is applied to the series circuit of the resistor 3 and the diode 2, and the DC biasing current $I_C$ flowing through the collector of the transistor 1 is measured for the ambient temperature, the result is shown in FIG. 3 in which the DC voltage E is varied from 6 volts to 20 volts 2 volts by successive increments of two volts. In FIG. 2, reference letter $A_1$ indicates an ammeter inserted into the collector circuit of the transistor 1.

As may be seen in FIG. 3, the compensation of the diode 2 for the transistor 1 becomes to an over-compensation and hence the DC biasing current $I_C$ has a negative temperature characteristic.

A stabilized transistor amplifier circuit of this invention, with which a biasing current is constant positively regardless of the ambient temperature change, will be described with reference to the drawings.

Figure 4:
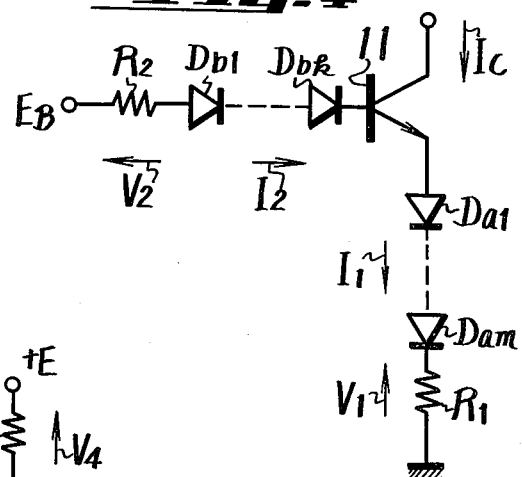
FIG. 4 is a principle circuit diagram of the transistor amplifier according to the present invention.

In this invention, as shown in FIG. 4, the emitter of a transistor 11 is connected through $m$ diodes $D_{a1}$, — $D_{am}$ (where $m$ is a positive integer) and a resistor $R_1$ to a reference voltage terminal such as the ground terminal, an input voltage $E_B$ is applied to the base of the transistor 11 through a resistor $R_2$ and $k$ number of diodes $D_{b1}$, — $D_{bk}$ (where $b$ is a positive integer), and the circuit constants thereof are selected to substantially satisfy the following equation (1).

$$\alpha V_{10} - \beta V_{20} + \gamma - (k + m + 1) = 0 \tag{1}$$

where $$\alpha = - K_R/\Delta V_{BE}, \beta = K_R - K_H/\Delta V_{BE}, \gamma = \Delta E_B/\Delta V_{BE} \tag{2}$$

and $V_{10}$ respresents a terminal voltage across the resistor $R_1$ at a certain pre-selected temperature $T_0$; $V_{20}$ a terminal voltage across the resistor $R_2$ at the pre-selected temperature $T_0$; $K_R$ the temperature coefficient of the resistors $R_1$ and $R_2$; $K_H$ the temperature coefficient of the current amplification factor $h_{FE}$ of the transistor 11 whose emitter is grounded; $\Delta E_B$ the increment per degree of the input voltage $E_B$; and $\Delta V_{BE}$ the increment per degree of the forwardly biased voltage drops the base-emitter of the transistor 11 and the respective diodes or PN-junction.

In this case, the numbers m and k of the diodes $D_{a1}$, — $D_{am}$, and $D_{b1}$, — $D_{bk}$ may be zero and the resistance values of the resistors $R_1$ and $R_2$ may be zero.

In practice, the circuit shown in FIG. 4 is formed on a common semiconductor wafer as an integrated circuit.

In the circuit shown in FIG. 4, if the input voltage is $E_{BO}$ and the forwardly biased voltage drop across the base-emitter PN-junction of the transistor 11 is $V_0$ at the pre-selected temperature $T_0$, the following equation (3) is established from equation (1).

$$E_{BO} - V_{10} - V_{20} - (k + m + 1) V_0 = 0 \tag{3}$$

If, further, it is assumed that, at the temperature $T_0$, the resistance value of the resistor $R_1$ is taken as $R_{10}$; that of the resistor $R_2$ as $R_{20}$; the DC biasing current flowing through the emitter of the transistor 11 as $I_1$; the current flowing into the base of the transistor 11 as $I_{20}$; and the current amplification factor of the transistor 11 as $h_0$, the following equations (4) are established.

$$V_{10} = R_{10} \cdot I_1, V_{20} = R_{20} \cdot I_{20} = R_{20} I_1/h_0 \tag{4}$$

If it is assumed that, at a certain temperature $T = T_0 + \Delta T$, the input voltage is taken as $E_B$; the terminal voltage across the resistor $R_1$ as $V_1$; that across the resistor $R_2$ as $V_2$; and the forwardly biased voltage drop across the PB-junction as $V_{BE}$, the following equation (5) is established.

$$E_B - V_1 - V_2 - (k + m + 1)V_{BE} = 0 \tag{5}$$

In order to make the DC biasing current $I_1$ constant even at the arbitrary temperature $T = T_0 + \Delta T$, it is sufficient that the voltages $V_1$ and $V_2$ in the equation (5) are expressed as follows on the assumption that the current amplification factor of the transistor 11 is $h_{FE}$ and the current flowing into the base of the transistor 11 is $I_2$.

$$V_1 = R_1 \cdot I_1, V_2 = R_2 \cdot I_2 = R_2 I_1/h_{FE} \tag{6}$$

Since the following equation (7) is established defines the change in the resistance $R_1$ as a function of temperature, $$R_1 = R_{10} (1 + K_R \cdot \Delta T) \tag{7}$$

the following equation (8) is obtained.

$$V_1 = R_{10} \cdot I_1 (1 + K_R \cdot \Delta T) = V_{10} (1 + K_R \cdot \Delta T) \tag{8}$$

Further, since the following relationships exist $$R_2 = R_{20} (1 + K_R \cdot \Delta T) \tag{9}$$

$$h_{FE} = h_0 (1 + K_H \cdot \Delta T) \tag{10}$$

the voltage $V_2$ can be expressed as follows.

$$V_2 = \frac{R_{20} \cdot I_1}{h_0} \cdot \frac{1 + K_R \cdot \Delta T}{1 + K_H \cdot \Delta T} \tag{11a}$$

In this case, since the following equation (11b) can be approximated $$\frac{1 + K_R \cdot \Delta T}{1 + K_H \cdot \Delta T} = 1 + (K_R - K_H) \Delta T \tag{11b}$$

the voltage $V_2$ can be expressed as follows.

$$V_2 = V_{20} \{1 + (K_R - K_H) \Delta T\} \tag{11}$$

Since the following equations (12) and (13) are obtained $$E_B = E_{BO} + \Delta E_B \cdot \Delta T \tag{12}$$

$$V_{BE} = V_0 + \Delta V_{BE} \cdot \Delta T \tag{13}$$

the following equation (14) is obtained by substituting the equations (8) and (11) to (13) into the equation (5).

$$(E_{BO} + \Delta E_B \cdot \Delta T) - V_{10}(1 + K_R \cdot \Delta T) - V_{20} \{1 + (K_R - K_H) \Delta T\} - (k + m + 1) (V_0 + \Delta V_{BE} \cdot \Delta T) = 0 \tag{14}$$

The following equation (15) can be obtained by substituting the equation (3) into the equation (14).

$$\Delta E_B - K_R \cdot V_{10} - (K_R - K_H)V_{20} - (k + m + 1)\Delta V_{BE} = 0 \tag{15}$$

If the equation (15) is divided by $\Delta V_{BE}$ and arranged, the following equation (16) is obtained.

$$-K_R/\Delta V_{BE} V_{10} - K_R - K_H/\Delta V_{BE} V_{20} + \Delta E_B/\Delta V_{BE} - (k + m + 1) = 0 \qquad (16)$$

If the equation (2) is substituted into the equation (16), the equation (1) is derived.

Therefore, the circuit constants are selected to substantially satisfy the equation (1), the DC biasing current $I_1$ can be always held constant regardless of the ambient temperature change. This will mean that the collector biasing current $I_C$ of the transistor 11 is held constant.

Figure 5:
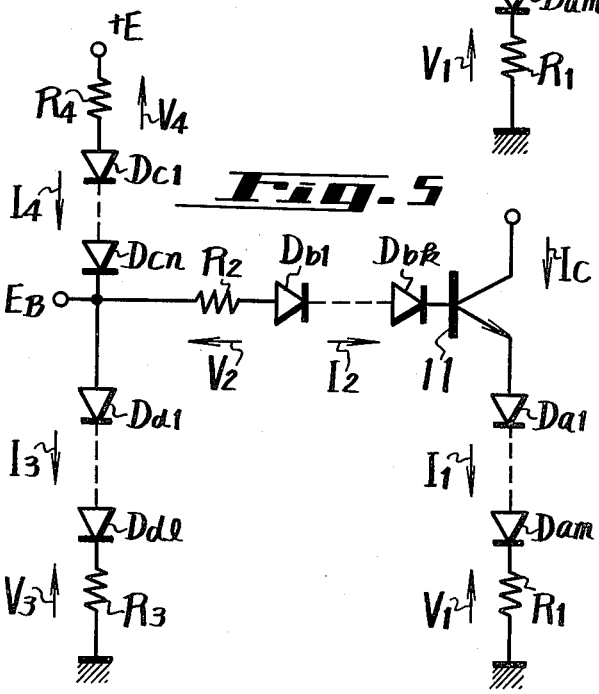
FIG. 5 is a circuit diagram showing one example for obtaining the input voltage $E_B$ in the circuit of FIG. 4.

A practical embodiment which may produce the input voltage $E_B$ will be described with reference to FIG. 5. As shown in FIG. 5, it is considered as the input voltage $E_B$ that a source voltage $+E$ is divided by a series connection of a resistor $R_4$ and n diodes $D_{c1}$, — $D_{cn}$, and a series connection of a resistor $R_3$ and diodes $D_{d1}$, — $D_{dl}$. In this case, the numbers $n$ and $l$ of the diodes could be zero and the resistance values of the resistors $R_3$ and $R_4$ could be zero.

In the case where the input voltage $E_B$ is obtained by the above circuit construction, it is assumed that, at the pre-selected temperature $T_0$, the terminal voltage across the resistor $R_3$ is taken as $V_{30}$; that across the resistor $R_4$ as $V_{40}$; and the increment per degree of the source voltage $+E$ as $\Delta E$. Thus, the following equation (17) is obtained.

$$\Delta E/\Delta V_{BE} = \gamma' \qquad (17)$$

In this case, the following factor (18) is substituted into the equation (1) instead of $\gamma$.

$$\frac{(\gamma' - n) V_{30} + lV_{40}}{V_{30} + V_{40}} \qquad (18)$$

Thus, the following equation (19) is derived.

$$\alpha V_{10} - \beta V_{20} + \frac{(\gamma' - n) V_{30} + lV_{40}}{V_{30} + V_{40}} - (k + m + 1) = 0 \qquad (19)$$

If the circuit constants are selected to approximately satisfy the above equation (19), the purpose is achieved.

In this case, at the pre-selected temperature $T_0$ the following equation (20a) is obtained $$V_{30} + lV_0 = V_{10} + V_{20} + (k + m + 1)V_0 \qquad (20a)$$

so that the next equation (20) is established.
$$-V_{10} - V_{20} + V_{30} + lV_0 - (k + m + 1)V_0 = 0 \qquad (20)$$

If it is assumed that, at the pre-selected temperature $T_0$, the resistance value of the resistor $R_3$ is taken as $R_{30}$ and the current flowing through the resistor $R_3$ as $I_{30}$, the voltage $V_{30}$ is expressed as follows.

$$V_{30} = R_{30} \cdot I_{30} \qquad (21)$$

Further, assuming that, at the pre-selected temperature $T_0$, the source voltage is taken as $E_0$; the resistance value of the resistor $R_4$ as $R_{40}$; the current $I_{20}$ flowing into the base of the transistor 11 is neglected; and the equal current $I_{30}$ flows through both the resistors $R_3$ and $R_4$, the current $I_{30}$ is expressed as follows.

$$I_{30} = \frac{E_0 - (n + l)V_0}{R_{30} + R_{40}} \qquad (22)$$

If the equation (22) is substituted into the equation (21) and then into the equation (20), the following equation (23) is obtained.

$$-V_{10} - V_{20} + R_{30}/R_{30} + R_{40}(E_0 - nV_0) + R_{40}/R_{30} + R_{40} lV_0 - (k + m + 1) = 0 \qquad (23)$$

If the equal current flows through the resistors $R_3$ and $R_4$ as described above, the following expressions (24) are established.

$$R_{30}/R_{30} + R_{40} = V_{30}/V_{30} + V_{40}, \; R_{40}/R_{30} + R_{40} = V_{40}/V_{30} + V_{40} \qquad (24)$$

If the terminal voltage across the resistor $R_3$ at the arbitrary temperature $T = T_0 + \Delta T$ is taken as $V_3$, the following equation (25a) is obtained.

$$V_3 + lV_{BE} = V_1 + V_2 + (k + m + 1)V_{BE} \qquad (25a)$$

Accordingly, the next equation (25) is established.

$$-V_1 - V_2 + V_3 + lV_{BE} - (k + m + 1)V_{BE} = 0 \qquad (25)$$

If the current flowing through the resistor $R_3$ at the arbitrary temperature $T = T_0 + \Delta T$ is assumed as $I_3$, the following expression (26) is obtained.

$$V_3 = R_3 \cdot I_3 \qquad (26)$$

Further, if it is assumed at this case that the current $I_2$ flowing into the base of the transistor 11 is neglected and the equal current flows through the resistors $R_3$ and $R_4$, the current $I_3$ is expressed as follows,.

$$I_3 = \frac{E - (n+l)V_{BE}}{R_3 + R_4} \qquad (27)$$

Thus, if the equation (27) is substituted into the equation (26) and then into the equation (25), the following equation (28) is obtained.

$$-V_1 - V_2 + R_3/R_3 + R_4 (E - nV_{BE}) + R_4/R_3 + R_4 lV_{BE} - (k + m + 1)V_{BE} = 0 \qquad (28)$$

In order to make that the DC biasing current $I_1$ is constant event at the arbitrary temperature $T = T_0 + \Delta T$, it is sufficient that in the equation (28) the voltages $V_1$ and $V_2$ are obtained by the equation (6) and accordingly (8) and (11).

In this case, since the following expressions (29) to (31) are obtained.

$$R_3 = R_{30} (1 + K_R \cdot \Delta T) \qquad (29)$$

$$R_4 = R_{40} (1 + K_R \cdot \Delta T) \qquad (30)$$

$$E = E_0 + \Delta E \cdot \Delta T \qquad (31)$$

and $V_{BE}$ is given by the equation (13), if the equations (8), (11), (29) to (31) and (13) are substituted into the equation (28), the next equation (32) is derived.

$$-V_{10}(1 + K_R \cdot \Delta T) - V_{20} \{1 + (K_R - K_H)\Delta T\} + R_{30}/R_{30} + R_{40} \{(E_0 + \Delta E.\Delta T) - n)V_0 + \Delta V_{BE} \cdot \Delta T)\} + R_{40}/R_{30} + R_{40} l(V_0 + \Delta V_{BE}.\Delta T) - (k + m + 1)(V_0 + \Delta V_{BE}. \Delta T) = 0 \qquad (32)$$

If the equation (23) is substituted into the equation (32), the next equation (33) is derived.

$$-K_R \cdot V_{10} - (K_R - K_H) V_{20} + R_{30}/R_{30} + R_{40} (\Delta E - n\Delta V_{BE}) + R_{40}/R_{30} + R_{40}l\Delta V_{BE} - (k + m + 1 1 \Delta V_{BE} = 0 \qquad (33)$$

If the equation (33) is divided by $\Delta V_{BE}$ and the equation (24) is substituted thereinto, the next equation (34) is derived.

$$-\frac{K_R}{\Delta V_{BE}}V_{10} - \frac{K_R - K_H}{\Delta V_{BE}}V_{20} + \frac{(\frac{\Delta E}{\Delta V_{BE}} - n)V_{30} + lV_{40}}{V_{30} + V_{40}} - (k + m + 1) = 0 \quad (34)$$

Accordingly, if $\alpha$, $\beta$ and $\gamma'$ are used in the equation (34) as in the case of the equations (2) and (17), it can be expressed similar to the equation (19).

As may be apparent from the foregoing, in the case that the input voltage $E_B$ is produced by the circuit shown in FIG. 5, if the circuit constants are selected to satisfy the equation (19) substantially, the DC biasing current $I_1$ can be made constant always irrespective of the ambient temperature change.

Based upon the circuit shown in FIG. 5, are various practical circuits. FIG. 6 shows one of such examples in which the biasing circuit for the transistor 11 is formed of the resistors $R_1$ to $R_4$ only; FIG. 7 shows another example in which only one diode $D_{d1}$ is connected in series to the resistor $R_3$ of the biasing circuit shown in FIG. 6, FIG. 8 shows a further embodiment in which only one diode $D_{c1}$ is connected in series to the resistor $R_4$ of the biasing circuit shown in FIG. 6; FIG. 9 shows a yet further example in which only one diode $D_{a1}$ is connected in series to the resistor $R_1$ of the biasing circuit shown in FIG. 6; and FIG. 10 shows a still further example in which one diode $D_{b1}$ is connected to the base of the transistor 11. It is also possible that a plurality of diodes $D_{a1}$, $D_{a2}$, $D_{c1}$ and $D_{d1}$ are connected as shown in FIG. 11. In any case, it is necessary that the circuit constants of the above circuits must be selected to satisfy the equation (19).

In the above explanation, it is to be noted that the equation (19) is a special case of the equation (1) and hence the former equation is included in the latter one. That is, several other equations may be derived from the equation (1) when certain special conditions are given.

If such a condition that the input voltage $E_B$ in FIG. 4 is held constant regardless of the ambient temperature change is given, the circuit constants thereof are selected to approximately satisfy the following equation (35) for making the circuit shown in FIG. 4 stable relative to the ambient temperature.

$$\alpha V_{10} - \beta V_{20} - (k + m + 1) = 0 \quad (35)$$

In detail, in the case that the input voltage $E_B$ is given by a constant voltage circuit 12 at the pre-stage as shown in FIG. 12, since $\Delta E_B = 0$ is held in the equation (2), $\gamma = 0$. Therefore, if the circuit constants are selected to substantially satisfy the equation (35) which is same as the case where $\gamma = 0$ in the equation (1), the DC biasing currents $I_1$ and $I_C$ become always constant regardless of the ambient temperature change. While, in the case that the input voltage $E_B$ is obtained by the circuit shown in FIG. 5, even if the source voltage E depends upon the ambient temperature, the equation (18) corresponding to $\gamma$ in the equation (1) is zero. Accordingly, if the following equation (36) is satisfied $$(\gamma' - n) V_{30} + lV_{40} = 0 \quad (36)$$

the input voltage $E_B$ becomes constant irrespective of the ambient temperature change. Thus, if the equation (35) is satisfied under the condition, the DC biasing currents $I_1$ and $I_C$ are made constant regardless of the ambient temperature change.

Assuming that such a condition that the input voltage $E_B$ is given from the source voltage $+E$ through the series connection of the resistor $R_4$ and the $n$'s number of diodes $D_{c1}$ to $D_{cn}$ and the current flowing through the resistor $R_4$ is constant regardless of the ambient temperature change is given. If the terminal voltage across the resistor $R_4$ is taken as $V_{40}$ at the pre-select temperature $T_0$; and in the equation (1) $(V_{10} + V_{40})$ is used in place of $V_{10}$, $\gamma'$ obtained by the equation (17) is used in place of $\gamma$, and $(n + k + m + 1)$ is used in place of $(k + m + 1)$, the next equation (37) is obtained.

$$\alpha(V_{10} + V_{40}) - \beta V_{20} + \gamma' - (n + k + m + 1) = 0 \quad (37)$$

Accordingly, if the circuit constants are selected to satisfy the equation (37), the given condition is obtained.

In this case, at the temperature $T_0$ the next equation (38a) is established.

$$E_0 = V_{10} + V_{20} + V_{40} + (n + k + m + 1) V_0 \quad (38a)$$

Thus, the next equation (38) is obtained.

$$-(V_{10} + V_{40}) - V_{20} + E_0 - (n + k + m + 1) V_0 = 0 \quad (38)$$

While, at the arbitrary temperature $T = T_0 + \Delta T$ the following equation (39a) is established.

$$E = V_1 + V_2 + V_4 + (n + k + m + 1) V_{BE} = 0 \quad (39a)$$

Thus, the next equation (39) is obtained.

$$-(V_1 + V_4) - V_2 + E - (n + k + m + 1) V_{BE} = 0 \quad (39)$$

In this case, since the current $I_4$ flowing through the resistor $R_4$ is always constant, the voltage $V_4$ is expressed as follows.

$$V_4 = R_4 \cdot I_4$$
$$= R_{40} \cdot I_4 (1 + K_R \cdot \Delta T)$$
$$= V_{40} (1 + K_R \cdot \Delta T) \quad (40)$$

In order to make the DC biasing current $I_1$ constant at the arbitrary temperature $T = T_0 + \Delta T$, it is sufficient that in the equation (39) $V_1$ and $V_2$ are obtained by the equation (6) and accordingly (8) and (11). Thus, if the equations (8), (11), (13), (31) and (40) are substituted into the equation (39), the next equation (41) is obtained.

$$-(V_{10} + V_{40})(1 + K_R \cdot \Delta T) - V_{20}\{1 + (K_R - K_H)\Delta T\} + (E_0 + \Delta E \cdot \Delta T) - (n + k + m + 1)(V_0 + \Delta V_{BE} \cdot \Delta T) = 0 \quad (41)$$

Then, if the equation (38) is substituted into the equation (41), the next equation (42) is obtained.

$$-K_R(V_{10} + V_{40}) - (K_R - K_H) V_{20} + \Delta E - (n + k + m + 1) \Delta V_{BE} = 0 \quad (42)$$

Thus, the following equation (43) is obtained by dividing the equation (42) with $\Delta V_{BE}$.

$$-K_R/\Delta V_{BE}(V_{10} + V_{40}) - K_R - K_H/\Delta V_{BE} V_{20} + \Delta E/\Delta V_{BE} - (n + k + m + 1) = 0 \quad (43)$$

Accordingly, $\alpha$, $\beta$ and $\gamma'$ are used in the equation (43) as in the case of the equations (2) and (17), the equation similar to that (37) is obtained.

With the circuit shown in FIG. 13, if the current $I_4$ flowing through the resistor $R_4$ is constant, by selecting the circuit constants to satisfy the equation (37) substantially, the DC biasing current $I_1$ can be made constant.

Figure 14:
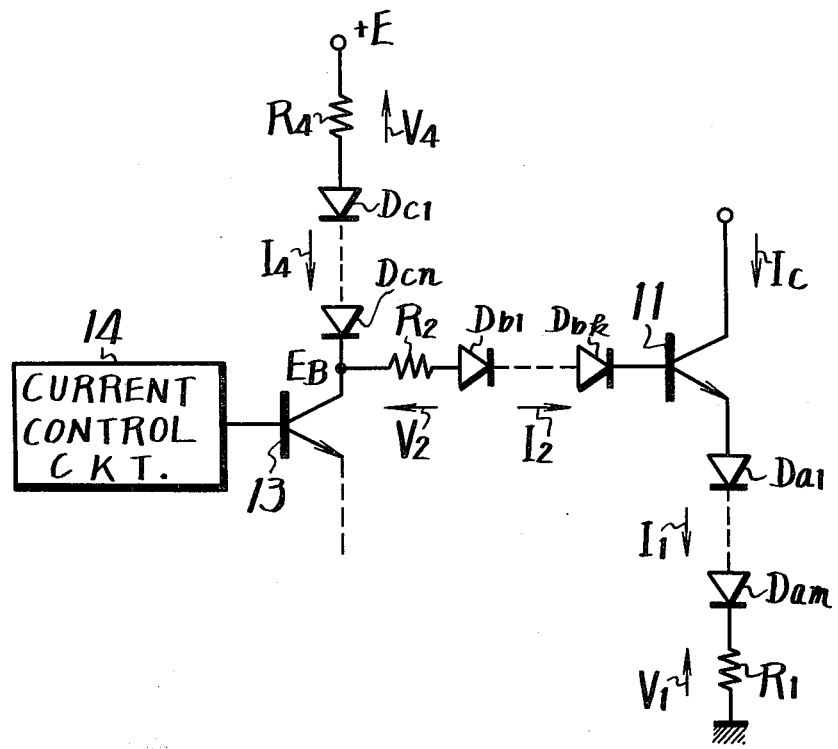
FIG. 14 is a circuit diagram showing one example of the constant current source of the circuit shown in FIG. 13.

In order to make the current $I_4$ flowing through the resistor $R_4$ in the circuit of FIG. 13 constant, there are two methods. The first method is that, as shown in FIG. 14, a transistor 13 is connected at the pre-stage of the circuit, the input voltage $E_B$ is derived as the collector voltage of the transistor 13, and a current control circuit 14 is connected to the base of the transistor 13 to make the collector current of the transistor 13 constant. The second method is that, as shown in FIG. 5, in the case of connecting the resistor $R_3$ and $l$'s diodes $D_{d1} - D_{dl}$ in the ground side of the circuit, if the current $I_2$ flowing into the base of the transistor 11 is neglected and hence the currents $I_3$ and $I_4$ flowing through the resistors $R_3$ and $R_4$ are taken as equal, it is necessary to make the currents constant regardless of the temperature.

The second method will be described in detail. If $I_3 = I_4 = I$, the current $I$ can be expressed similar to the equation (27) as follows.

$$I = \frac{E - (n+l)V_{BE}}{R_3 + R_4} \quad (44)$$

If the equations (29) to (31) and (13) are substituted into the equation (44), the current $I$ is expressed as follows.

$$I = \frac{(E_0 + \Delta E \cdot \Delta T) - (n+l)(V_0 + \Delta V_{BE} \cdot \Delta T)}{(R_{30} + R_{40})(1 + K_R \cdot \Delta T)}$$

$$\approx \frac{E_0 - (n+l)V_0}{R_{30} + R_{40}} \left[ 1 + \frac{\Delta E - (n+l)\Delta V_{BE}}{E_0 - (n+l)V_0} \cdot \Delta T (1 - K_R \cdot \Delta T) \right]$$

$$\approx \frac{E_0 - (n+l)V_0}{R_{30} + R_{40}} \left[ 1 + \frac{\Delta E - (n+l)\Delta V_{BE}}{E_0 - (n+l)V_0} K_R \Delta T \right] \quad (45)$$

Accordingly, if the following term (46a) is 0

$$\frac{\Delta E - (n+l)\Delta V_{BE}}{E_0 - (n+l)V_0} - K_R = \frac{\Delta E - (n+l)\Delta V_{BE} - K_R(V_{30} + V_{40})}{V_{30} + V_{40}} \quad (46a)$$

or the following equation (46) is satisfied, $$-K_R(V_{30} + V_{40}) + \Delta E - (n+l)\Delta V_{BE} = 0 \quad (46)$$

the current $I$ becomes constant.

If the equation (46) is divided by $\Delta V_{EB}$, the next equation (47a) and accordingly (47) are obtained.

$$-K_R/\Delta V_{BE}(V_{30} + V_{40}) + \Delta E/\Delta V_{BE} - (n+l) = 0 \quad (47a)$$

$$\alpha(V_{30} + V_{40}) + \gamma' - (n+l) = 0 \quad (47)$$

Accordingly, in the latter case if the circuit constants are selected to satisfy both the equations (47) and (37), the DC biasing current $I_1$ becomes constant.

Figure 15:
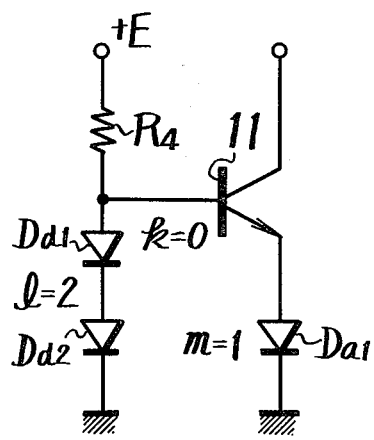
FIGS. 15 and 16 are circuit diagrams showing other examples for obtaining constant current sources in embodied circuits of FIG. 4 respectively.
Figure 16:
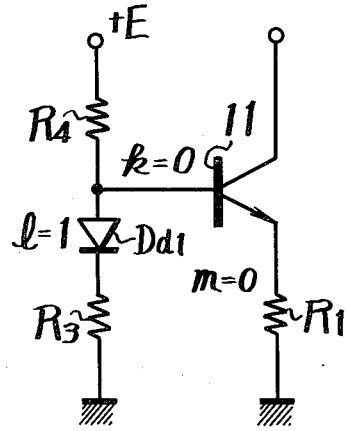

In this case, when $(k + m + 1) = l$ and $R_2 = 0$ or $V_{20} = 0$ as in the case of FIG. 15 or FIG. 16, $V_{10} = V_{30}$ is satisfied. Therefore, the equation (47) coincides with the equation (37), so that in this case it is sufficient to select the circuit constants so as to satisfy the equation (37) or (47).

In the circuits shown in FIGS. 4 – 5 and 7 – 16, one or plurality of diodes are used, and in practice the diodes are formed of transistors whose bases and collectors are connected directly, but it may possible to employ transistors whose bases and collectors are connected through resistors in place of the diodes, as described later.

Figure 17:
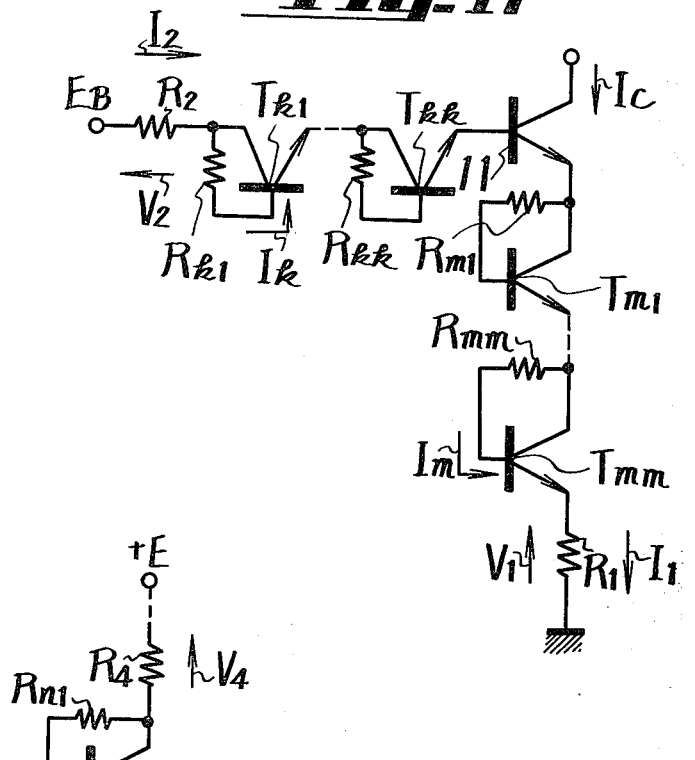
FIG. 17 is another principle circuit diagram of the transistor amplifier according to the present invention.

FIG. 17 shows a circuit in which a transistor whose base and collector are connected through a resistor is used in place of the diode used in the circuit of FIG. 4.

In the circuit of FIG. 17, the emitter of the transistor 11 is connected to the reference voltage terminal such as the ground terminal through m's number of transistors $T_{m1}$ to $T_{mm}$ whose bases and collectors are connected through resistors $R_{m1}$ to $R_{mm}$, respectively, and through the resistor $R_1$. The base of the transistor 11 is supplied with the input voltage $E_B$ through the resistor $R_2$ and through k's number of transistors $T_{k1}$ to $T_{kk}$ whose bases and collectors are connected through resistors $R_{k1}$ to $R_{kk}$, respectively.

If the circuit constants of the circuit shown in FIG. 17 are selected to substantially satisfy the next equation (48), $$\alpha V_{10} - \beta(V_{20} + V_{m0}) - \delta V_{k0} + \gamma - (k + m + 1) = 0 \quad (48)$$

the circuit of FIG. 17 becomes stable for the ambient temperature, as described below in detail.

In the equation (48), $\delta$ is expressed as follows, $$\delta = K_R - 2K_H/\Delta V_{BE} \quad (49)$$

$V_{m0}$ is the total voltage of the terminal voltages across the respective resistors $R_{m1}$ to $R_{mm}$ connected to the transistors $T_{m1}$ to $T_{mm}$ which are, in turn, connected to the emitter of the transistor 11 at the pre-selected temperature $T_0$, and $V_{k0}$ the total voltage of the terminal voltages across the respective resistors $R_{k1}$ to $R_{kk}$ connected to the transistors $T_{k1}$ to $T_{kk}$ which are, in turn, connected to the base of the transistor 11 at the pre-selected temperature $T_0$.

In this case, it may be possible that the numbers $m$ and $k$ of the transistors are zero and the resistance values of the resistors $R_1$ and $R_2$ are zero.

The equation (48) is derived as follows. In the circuit of FIG. 17, the following equation (50) is established at the pre-selected temperature $T_0$.

$$E_{B0} - V_{10} - V_{20} - V_{m0} - V_{k0} - (k + m + 1) = 0 \quad (50)$$

If it is assumed that, at the pre-selected temperature $T_0$, the total resistance value of the resistance values of the resistors $R_{m1}$ to $R_{mm}$ is taken as $R_{m0}$; that of the resistors $R_{k1}$ to $R_{kk}$ taken as $R_{k0}$; the current flowing through the resistors $R_{m1}$ to $R_{mm}$ taken as $I_{m0}$; and that flowing through the resistors $R_{k1}$ to $R_{kk}$ taken as $I_{k0}$, the current $I_{m0}$ and $I_{k0}$ are expressed as follows.

$$I_{m0} = I_1/h_0, \quad I_{k0} = I_1/h_0^2 \tag{51}$$

Therefore, the voltages $V_{m0}$ and $V_{k0}$ are expressed as follows.

$$V_{m0} = R_{m0} \cdot I_{m0} = R_{m0} \cdot I_1/h_0 \tag{52}$$

$$V_{k0} = R_{k0} \cdot I_{k0} = R_{k0} \cdot I_1/h_0 \tag{53}$$

If it is assumed at the arbitary temperature $T = T_0 + \Delta T$ that the total terminal voltage across the resistors $R_{m1}$ to $R_{mm}$ is taken as $V_m$ and the total terminal voltage across the resistors $R_{k1}$ to $R_{kk}$ as $V_k$, the following equation (54) is established.

$$E_B - V_1 - V_2 - V_m - V_k - (k + m + 1) V_{BE} = 0 \tag{54}$$

In order to make that the DC biasing current $I_1$ is constant even at the arbitrary temperature $T = T_0 + \Delta T$, the voltages $V_1$ and $V_2$ in the equation (54) are given by the equation (6) and accordingly by the equations (8) and (11). Further, if, at the arbitrary temperature $T = T_0 + \Delta T$, the current flowing through the resistors $R_{m1}$ to $R_{mm}$ is assumed as $I_m$ and that through the resistors $R_{k1}$ to $R_{kk}$ as $I_k$, they are expressed as follows.

$$I_m = I_1/h_{FE}, \quad I_k = I_1/h_{FE}^2 \tag{55}$$

Accordingly, if, at the arbitrary temperature $T = T_0 + \Delta T$, the total resistance value of the resistors $R_{m1}$ to $R_{mm}$ is assumed as $R_m$ and that of the resistors $R_{k1}$ to $R_{kk}$ as $R_k$, it is sufficient that the voltages $V_m$ and $V_k$ are expressed as follows.

$$V_m = R_m \cdot I_m = R_m \, I_1/h_{FE} \tag{56}$$

$$V_k = R_k \cdot I_k = R_k \, I_1/h_{FE}^2 \tag{57}$$

Since the resistance value $R_m$ is expressed as $$R_m = R_{m0}(1 + K_R \cdot \Delta T) \tag{58}$$

and the factor $h_{FE}$ is given by the equation (10), the voltage $V_m$ is expressed as follows.

$$V_m = R_{m0} \cdot \frac{I_1}{h_0} \cdot \frac{1 + K_R \cdot \Delta T}{1 + K_H \cdot \Delta T}$$

$$= V_{m0} \{1 + (K_R - K_H) \Delta T\} \tag{59}$$

Further, since the resistance value $R_k$ is expressed as $$R_k = R_{k0}(1 + K_R \cdot \Delta T) \tag{60}$$

the voltage $V_k$ is expressed as follows.

$$V_k = R_{k0} \cdot \frac{I_1}{h_0^2} \cdot \frac{1 + K_R \cdot \Delta T}{(1 + K_H \cdot \Delta T)^2} \tag{61a}$$

Since the term $$\frac{1 + K_R \cdot \Delta T}{(1 + K_H \cdot \Delta T)^2}$$

is approximately expressed as $$\frac{1 + K_R \cdot \Delta T}{(1 + K_H \cdot \Delta T)^2} \approx \frac{1 + K_R \cdot \Delta T}{1 + 2K_H \cdot \Delta T}$$

$$\approx (1 + K_R \cdot \Delta T)(1 - 2K_H \cdot \Delta T)$$
$$\approx 1 + (K_R - 2K_H) \Delta T \tag{61b}$$

the next equation (61) is obtained.

$$V_k = V_{k0} \{1 + (K_R - 2K_H)\Delta T\} \tag{61}$$

Accordingly, if the equations (8), (11) to (13), (59) and (61) are substituted into the equation (54), the next equation (62) is obtained.

$$(E_{B0} + \Delta E_B \cdot \Delta T) - V_{10}(1 + K_R \cdot \Delta T) - V_{20}\{1 + (K_R - K_H)\Delta T\} - V_{m0}\{1 + (K_R - K_H)\Delta T\} - V_{k0}\{1 + (K_R - 2K_H)\Delta T\} - (k + m + 1)(V_0 + \Delta V_{BE} \cdot \Delta T) = 0 \tag{62}$$

Then, if the equation (50) is substituted into the equation (62), the next equation (63) is obtained.

$$\Delta E_B - K_R \cdot V_{10} - (K_R - K_H)(V_{20} + V_{m0}) - (K_R - 2K_H) V_{k0} - (k + m + 1) \Delta V_{BE} = 0 \tag{63}$$

If the equation (63) is divided by $\Delta V_{BE}$ and then arranged, the next equation (64) is obtained.

$$- K_R/\Delta V_{BE} \, V_{10} - K_R - K_H/\Delta V_{BE}(V_{20} + V_{m0}) - K_R - 2K_H/\Delta V_{BE} \, V_{k0} + \Delta E_B/\Delta V_{BE} - (k + m + 1) = 0 \tag{64}$$

Thus, if the terms $\alpha$, $\beta$, $\gamma$ and $\delta$ are used in the equation (64) as in the case of the equations (2) and (49), the equation (48) is derived.

In other words, if the circuit constants are selected to substantially satisfy the equation (48), the DC biasing current $I$ can be made always constant regardless of the ambient temperature change.

Figure 18:
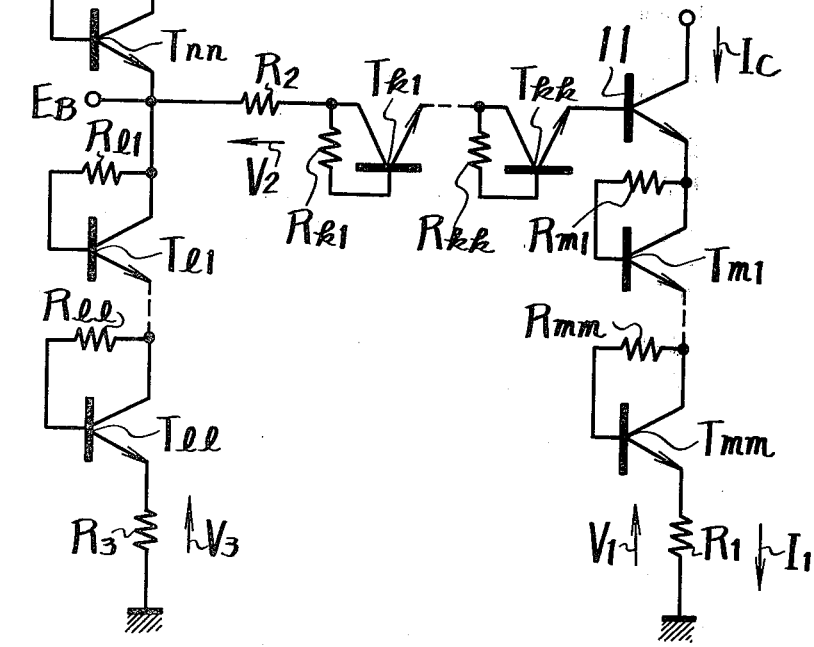
FIG. 18 is a circuit diagram showing one example for obtaining the input voltage $E_B$ in the circuit of FIG. 17.

As a practical embodiment which produces the input voltage $E_B$, considered is a circuit as shown in FIG. 18, in which the source voltage $+E$ is divided by a series connection of the resistor $R_4$, $n$'s number of transistors $T_{n1}$ to $T_{nn}$ whose bases and collectors are connected through resistors $R_{n1}$ to $R_{nn}$, respectively, and by a series connection of the resistor $R_3$ and $l$'s number of transistors $T_{l1}$ to $T_{ll}$ whose bases and collectors are connected through resistors $R_{l1}$ to $R_{ll}$. In this case, the numbers $n$ and $L$ of the transistors could be zero and the resistance values of the resistors $R_3$ and $R_4$ could be zero.

When the input voltage $E_B$ is produced by the circuit described above, if it is assumed that the terminal voltages across the resistors $R_1$, $R_2$, $R_3$ and $R_4$ at the pre-selected temperature $T_0$ are taken as $V_{10}$, $V_{20}$, $V_{30}$ and $V_{40}$; the total voltages of the resistors $R_{m1}$ to $R_{mm}$, $R_{k1}$ to $R_{kk}$, $R_{n1}$ to $R_{nn}$ and $R_{l1}$ to $R_{ll}$ at the pre-selected temperature $T_0$ are taken as $V_{m0}$, $V_{k0}$, $V_{n0}$ and $V_{l0}$, respectively; and the factors $\alpha$, $\beta$, $\gamma'$ and $\delta$ are determined as in the equations (2), (17) and (49), the following equation (65) is obtained.

$$\frac{\alpha V_{10} - \beta(V_{20} + V_{m0}) - \delta V_{k0}}{V_{30} + V_{40} + V_{n0} + V_{l0} - (k + m + 1)} + \frac{\{\gamma' - n - (\alpha + \beta)V_{n0}\}V_{30} + \{l + (\alpha + \beta) V_{l0}\}V_{40} + IV_{n0} + (\gamma' - n)V_{l0}}{V_{30} + V_{40} + V_{n0} + V_{l0} - (k + m + 1)} = 0 \tag{65}$$

Therefore, if the circuit constants are selected to substantially satisfy the above equation (65), the purpose is achieved.

As described above, according to the circuit of this invention, the DC biasing current can be always made constant regardless of the ambient temperature change and hence the stable amplification operation can be performed.

It will be apparent that many modifications and variations could be effected by one skilled in the art without departing from the spirits and scope of the novel concepts of this invention.

I claim as my invention:

1. A stabilized amplifier comprising:
   A. a transistor having base, emitter and collector electrodes;
   B. circuit means comprising $m$ diodes and a first resistor for connecting the emitter electrode of said transistor to a reference voltage terminal where $m$ is a positive integer; and
   C. circuit means comprising $k$ diodes and a second resistor connected in series between the base electrode of said transistor and an input voltage terminal having a voltage value of $E_B$ where $k$ is a positive integer, wherein circuit constants of the amplifier are selected to satisfy the equation:

$$\alpha V_{10} - \beta V_{20} + \gamma - (k + m + 1) = 0$$

where
$\alpha = - K_R/\Delta V_{BE}$,
$\beta = K_R - K_H/\Delta V_{BE}$,
$\gamma = \Delta E_B/\Delta V_{BE}$,
$V_{10}$ is a voltage drop across the first resistor at a certain pre-selected temperature,
$V_{20}$ is a voltage drop across the second resistor at the pre-selected temperature,
$K_R$ is a temperature coefficient of the first and second resistors,
$K_H$ is a temperature coefficient of a current amplification factor $h_{FE}$ of the transistor when connected as a common emitter configuration,
$\Delta E_B$ is an increment per degree of the input voltage $E_B$, and
$\Delta V_{BE}$ is an increment per degree of a voltage drop $V_{BE}$ across a forwardly biased PN junction.

2. A stabilized amplifier according to claim 1, wherein said amplifier further comprises:
   1. a first series circuit comprising $l$ diodes and a third resistor where $l$ is a positive integer;
   2. a second series circuit comprising $n$ diodes and a fourth resistor where $n$ is a positive integer;
   3. circuit means for connecting said first and second series circuits in a series between a power supply voltage terminal having a voltage value of $E$ and the reference voltage terminal; and
   4. means for connecting said input voltage terminal of $E_B$ to a connection point between said first and second series circuits, wherein circuit constants of the amplifier are selected to satisfy the following equation:

$$\alpha V_{10} - \beta V_{20} + \frac{(\gamma - n)V_{30} + lV_{40}}{V_{30} + V_{40}} - (k + m + 1) = 0$$

where
$\gamma' = \Delta E/\Delta V_{BE}$,
$V_{30}$ is a voltage drop across the third resistor at the pre-selected temperature,
$V_{40}$ is a voltage drop across the fourth resistor at the pre-selected temperature, and
$\Delta E$ is an increment per degree of the power supply voltage $E$.

3. A stabilized amplifier according to claim 1, wherein said amplifier further comprises:
   1. a series circuit comprising $n$ diodes and a resistor $R_4$ where $n$ is a positive integer;
   2. a constant current circuit;
   3. circuit means for connecting said series circuit and said constant current circuit between a power supply voltage terminal having a voltage value of $E$ and the reference voltage terminal where the constant current circuit makes the current flow through said $n$ diodes and said resistor $R_4$ substantially constant regardless of the ambient temperature; and
   4. means for connecting said input voltage terminal of $E_B$ to a connection point between said series circuit and said constant current circuit; wherein circuit constants of the amplifier are selected to satisfy the following equation:

$$\alpha(V_{10} + V_{40}) - \beta V_{20} + \gamma' - (n + k + 1) = 0$$

where
$\gamma' = \Delta E/\Delta V_{BE}$
$V_{40}$ is a voltage drop across the resistor $R_4$ at the pre-selected temperature, and
$\Delta E$ is an increment per degree of the power supply voltage $E$.

4. A stabilized amplifier according to claim 3, wherein said constant current circuit comprises:
   1. a transistor having base, emitter and collector electrodes; kj
   2. current control means connected to the base electrode of said transistor; and
   3. circuit means for connecting the collector electrode of said transistor to said series circuit.

5. A stabilized amplifier comprising:
   A. an amplifying transistor having base, emitter and collector electrodes;
   B. circuit means comprising $m$ first transistors $(T_{m1},—,T_{mm})$ and a first resistor $R_1$ for connecting the emitter electrode of said amplifying transistor to a reference voltage terminal, said $m$ transistors having base, emitter and collector electrodes respectively, the base and collector electrodes thereof being connected by means of resistors $(R_{m1},—, R_{mm})$ respectively, and the collector-emitter paths thereof being respectively connected in series with the first resistor $R_1$ where $m$ is a positive integer; and
   C. circuit means comprising $k$ second transistors $(T_{k1},—, T_{kk})$ and a second resistor $R_2$ for connecting the base electrode of said amplifying transistor to an input voltage terminal $E_B$, said $k$ of transistors having base, emitter and collector electrodes respectively, the base and collector electrodes thereof being connected by means of resistors $(R_{k1},—, R_{kk})$ respectively, and the collector - emitter paths thereof being respectively connected in series with the second resistor $R_2$ where k is a positive integer, wherein several circuit constants of the amplifier are selected to satisfy the following equation:

$$\alpha V_{10} - \beta(V_{20} + V_{m0}) - \delta V_{k0} + \gamma - (k + m + 1) = 0$$

where
$\alpha = - K_R/\Delta V_{BE}$,
$\beta = K_R - K_H/\Delta V_{BE}$,
$\gamma = \Delta E_B/\Delta V_{BE}$,
$\delta = K_R - 2K_H/\Delta V_{BE}$,
$V_{10}$ is a voltage drop across the first resistor $R_1$ at a certain pre-selected temperature,
$V_{20}$ is a voltage drop across the second resistor $R_2$ at the pre-selected temperature,
$V_{m0}$ is a total voltage drop across the m of resistors ($R_{m1}, —, R_{mm}$) at the pre-selected temperature,
$V_{k0}$ is a total voltage drop across the k resistors ($R_{k1}, —, R_{kk}$) at the pre-selected temperature,
$K_R$ is a temperature coefficient of the first and second resistors, the m resistors and the k resistors,
$K_H$ is a temperature coefficient of a current amplification factor $h_{FE}$ of the amplifying transistor, the m transistors and the k transistors when each of the transistors is connected as a common-emitter configuration,
$\Delta E_B$ is an increment per degree of the input voltage $E_B$, and
$\Delta V_{BE}$ is an increment per degree of a voltage drop $V_{BE}$ across a forwardly biased PN junction.

6. A stabilized amplifier comprising:
A. a transistor having base, emitter, and collector electrodes;
B. first means comprising a resistor connecting said emitter to a reference voltage terminal, said resistor having a temperature co-efficient $K_R$;
C. an input voltage source having a voltage $E_B$ and an increment of $\Delta E_B$ per degree of temperature at a pre-selected temperature, said transistor having a base-emitter voltage drop $V_{BE}$ that changes at an increment $\Delta V_{BE}$ per degree of temperature change at said pre-selected temperature; and
D. second means connecting said base to said input voltage source, where
$\alpha V_{10} + \gamma = 1$,
$\alpha = - K_R/\Delta V_{BE}$,
$\gamma = \Delta E_B/\Delta V_{BE}$, and $V_{10}$ is the voltage drop across the resistor at said pre-selected temperature.

7. The stabilized amplifier of claim 6 in which said second means comprises a second resistor having said temperature coefficient of $K_R$, where
$\alpha V_{10} - \beta V_{20} + \gamma = 1$
$\beta = K_R - K_H/\Delta V_{BE}$
$K_H$ is the temperature coefficient of the current amplification factor $h_{Fe}$ of the transistor when connected as a common emitter configuration, and
$V_{20}$ is the voltage drop across said second resistor at said pre-selected temperature.

8. The stabilized amplifier of claim 7 comprising, in addition, a series circuit comprising:
A. a third resistor connected in series with said second resistor between said voltage source and the base of said transistor; and
B. a fourth resistor connected in series with said second resistor between the base of said transistor and said reference voltage terminal, where $$\alpha V_{10} - \beta V_{20} + \gamma V_{30}/V_{30} + V_{40} = 1,$$

$V_{30}$ is the voltage drop across the third resistor at said pre-selected temperature, and
$V_{40}$ is the voltage drop across the fourth resistor.

9. A stabilized amplifier comprising:
A. a transistor having base, emitter, and collector electrodes;
B. first means connecting said emitter to a reference voltage terminal;
C. an input voltage source having a voltage $E_B$ and an increment of $\Delta E_B$ per degree of temperature at a preselected temperature, said transistor having a base-emitter voltage drop $V_{BE}$ that changes at an increment $\Delta V_{BE}$ per degree of temperature change at said pre-selected temperature; and
D. second means comprising a resistor connecting said base to said input voltage source, where $\gamma - \beta V_{20} = 1$,
$\beta = K_R - K_H/\Delta V_{BE}$,
$K_H$ is the temperature co-efficient of the current amplification factor $h_{FE}$ of the transistor when connected as a common emitter configuration, $\gamma = \Delta E_B/\Delta V_{BE}$, and
$V_{20}$ is the voltage drop across said resistor at said pre-selected temperature.

* * * * *